(12) United States Patent
Guth et al.

(10) Patent No.: US 6,285,556 B1
(45) Date of Patent: Sep. 4, 2001

(54) ELECTRICAL BOARD SECUREMENT AND VOLTAGE ISOLATION DEVICE

(75) Inventors: Matthew T. Guth, Hendersonville; Rolando F. Martinez, Arden, both of NC (US)

(73) Assignee: Eaton Corporation, Cleveland, OH (US)

(*) Notice: Subject to any disclaimer, the term of this patent is extended or adjusted under 35 U.S.C. 154(b) by 0 days.

(21) Appl. No.: 09/368,790

(22) Filed: Aug. 5, 1999

(51) Int. Cl.[7] ............................... H05K 7/12; H05K 7/14
(52) U.S. Cl. .................... 361/752; 361/801; 361/802; 211/41.17; 206/706; 248/560
(58) Field of Search ................... 361/752, 753, 361/759, 801, 802, 740; 439/377; 211/41.17; 206/706, 707; 248/560, 559

(56) References Cited

U.S. PATENT DOCUMENTS

| | | | |
|---|---|---|---|
| 5,642,263 | * 6/1997 | Lauruhn | 361/801 |
| 5,943,218 | * 8/1999 | Liu | 361/801 |
| 6,056,574 | * 5/2000 | Yeomans et al. | 439/327 |
| 6,157,543 | * 12/2000 | Ashdown et al. | 361/759 |

* cited by examiner

Primary Examiner—Jayprakash N. Gandhi
(74) Attorney, Agent, or Firm—Martin J. Moran

(57) ABSTRACT

A molded circuit board securement and voltage isolation device is provided for use with one or more circuit boards or related electrical apparatus in an electrical enclosure. The device includes an open housing which has a base and opposing side walls positioned transversely with respect to the base. A stiffener such as a bridge is provided to provide the physical stiffness for the device and to resist mechanical vibration. The bridge spans the opposing side walls which have slots formed therein to permit the receipt of electrical apparatus such as circuit boards, for example. Circuit boards are secured in the device in substantially perpendicular alignment both with respect to the base and the opposing side walls. In another aspect of this device, at least two circuit boards can be positioned in a housing with a solid support wall formed between them to conserve available space. The solid support wall and the secure positioning of the circuit boards provides separation between the boards which promotes voltage isolation.

4 Claims, 3 Drawing Sheets

ELECTRICAL BOARD SECUREMENT AND VOLTAGE ISOLATION DEVICE

BACKGROUND OF THE INVENTION

1. Field of the Invention

The present invention generally relates to the positioning and securement of electrical apparatus. The present invention more particularly relates to a voltage isolation and vibration control device for electrical apparatus including circuit boards installed in a manufactured assembly, such as an electrical cabinet.

2. Description of the Prior Art

Apparatus and methods for positioning, securing and storing electrical components, including circuit boards used for holding electrical components such as capacitors, transformers and resistors, are generally known in the art.

A typical circuit board is provided as a generally rectangular piece of board material which has a surface area suitable for mounting electrical components such as amplifiers, switches, transformers, capacitors, microprocessors and the like. During conventional manufacturing assembly, the circuit board is mounted with a surface area positioned parallel to the back or base surface of an electrical housing, such as a metal electrical cabinet. This parallel orientation of the circuit board can substantially limit available space in the cabinet or enclosure in which the circuit board is installed.

One surface area of the circuit board typically does not have components mounted thereon and is attached directly to the interior of the metal cabinet, such as by insulative spacers which provide an offset distance between the circuit board and the enclosure. The circuit board can be mounted an offset distance of approximately 0.25 inches from the inside surface of the electrical cabinet. This direct mounting, however, can result in damage to the circuit board and its associated components. The mechanical vibrations of rotating equipment, for example, operated adjacent to the electrical cabinet can adversely impact the proper functioning of a directly mounted circuit board.

An electric generator, for example, can generate substantial and detrimental vibrational forces on its own circuitry and electrical components during its operation. With respect to the excitation and control circuitry of the generator, conventional circuit board positioning and securement techniques generally do not sufficiently account for the negative effects of mechanical vibration on the physical structure and electrical operation of the circuit board and its associated components. The rotating shaft of the electric generator produces mechanical vibrations which can cause the generator's excitation and control circuitry to malfunction. In particular, a generator which has been operated over an extended length of time tends to produce more severe mechanical vibrations during its operation, especially near the end of its expected life. In addition, generators which are installed on stationary foundations can be susceptible to vibrations including those caused by earthquakes or other similar seismic events.

Another problem associated with conventional circuit board positioning and securement is how to maintain electrical voltage isolation both between the individual circuit boards and between the circuit boards and the enclosure which contains the circuit boards. An enclosure for circuit boards is typically provided as a metal enclosure. In addition, the use of metal or another electrically conductive material to mount circuit boards directly to a metal electrical housing often does not provide sufficient electrical isolation. This insufficient voltage isolation is of particular concern for potential differences in the range of approximately 2,000 volts sustained on the circuit board.

The use of metal or another suitable material to position and secure circuit boards is also substantially more expensive than the use of plastic materials, for example, such as resinous, molded plastic. Therefore, an additional consideration is that use of metal for either securement or attachment of electrical apparatus such as circuit boards can substantially increase manufacturing and maintenance costs for the apparatus and for the larger system or assembly in which it is employed.

In summary, conventional assembly design for electrical apparatus is deficient in its ability to protect electrical components on circuit boards from the potential threat of damage or failure caused by mechanical vibration. In general, conventional electrical component securement design does not provide a convenient and economical way to establish voltage isolation for components mounted on circuit boards. Conventional electrical devices used for positioning and securement also have not focused sufficiently on economizing available space and avoiding the costs of utilizing expensive resources such as metal and similar materials.

SUMMARY OF THE INVENTION

The electrical apparatus securement and voltage isolation device of the present invention has satisfied the above-mentioned needs which arise from conventional electrical board installation.

The present invention provides a molded circuit board securement and electrical isolation device for use with at least one circuit board which is provided as a generally flat and rectangular piece. The securement and voltage isolation device of the present invention includes an open housing having a base and opposing side walls. The side walls are formed integrally with or connected to the base and are positioned transversely with respect to the base. A stiffener such as a bridge or support wall connects the opposing side walls to provide the securement and voltage isolation device of the present invention with general physical stiffness and the ability to resist the negative impact of mechanical vibration.

The opposing side walls of the device of the present invention have slots formed therein which permit the edges of a circuit board to be received generally adjacent to the side walls and to be positioned in substantial transverse alignment with respect to both the base and the opposing side walls. These slots can be formed within a set of ribs which extend from the side walls and which provide additional physical stiffness to the device. In addition, structures such as projections may be formed integrally with the base and positioned adjacent to a surface of the circuit board when the circuit board is received into the slots. These projection structures provide additional stabilization and securement of the circuit board within the housing of the present invention.

In another embodiment of the present invention, one circuit board is positioned and secured generally adjacent to at least one other circuit board in the same housing. This molded circuit board securement and voltage isolation device is provided for the securement of more than one circuit board. This device includes an open housing which has a base and opposing side walls each positioned transversely with respect to said base. A stiffener such as a bridge spans the side walls to establish a vibration tolerance for the device. Receiving structures, which may be provided as sets of slots, are formed in ribs extending from the side walls to receive first and second circuit boards generally adjacently to first and second sides of the bridge. The bridge can be replaced with a solid support wall to promote voltage isolation between circuit boards. The circuit boards are received in substantially transverse alignment with respect to the base and the opposing side walls. In addition, projections can extend from the base to further secure and stabilize the circuit boards within the housing. This embodiment of the present invention promotes effective utilization of available space used for positioning and securing multiple circuit boards.

It is therefore an object of the present invention to provide a securement and voltage isolation device which maintains board-to-board and board-to-enclosure voltage isolation.

It is a further object of the present invention to provide voltage isolation for medium voltages such as in the range of approximately 2,000 volts.

It is a still further object of the present invention to provide a device which maximizes the use of space in an electrical housing.

It is a still further object of the present invention to provide a device which resists damage and failure of electrical components by resisting the effects of mechanical vibration.

It is a still further object of the present invention to provide an apparatus which promotes accessibility of circuit boards in their installation and removal from an electrical housing.

It is a stiff further object of the present invention to provide a voltage isolation and securement device composed of material which is relatively inexpensive to manufacture and install.

These and other objects of the present invention will be more fully understood from the following description of the invention on reference to the illustrations appended thereto.

DETAILED DESCRIPTION OF THE INVENTION

Figure 1:
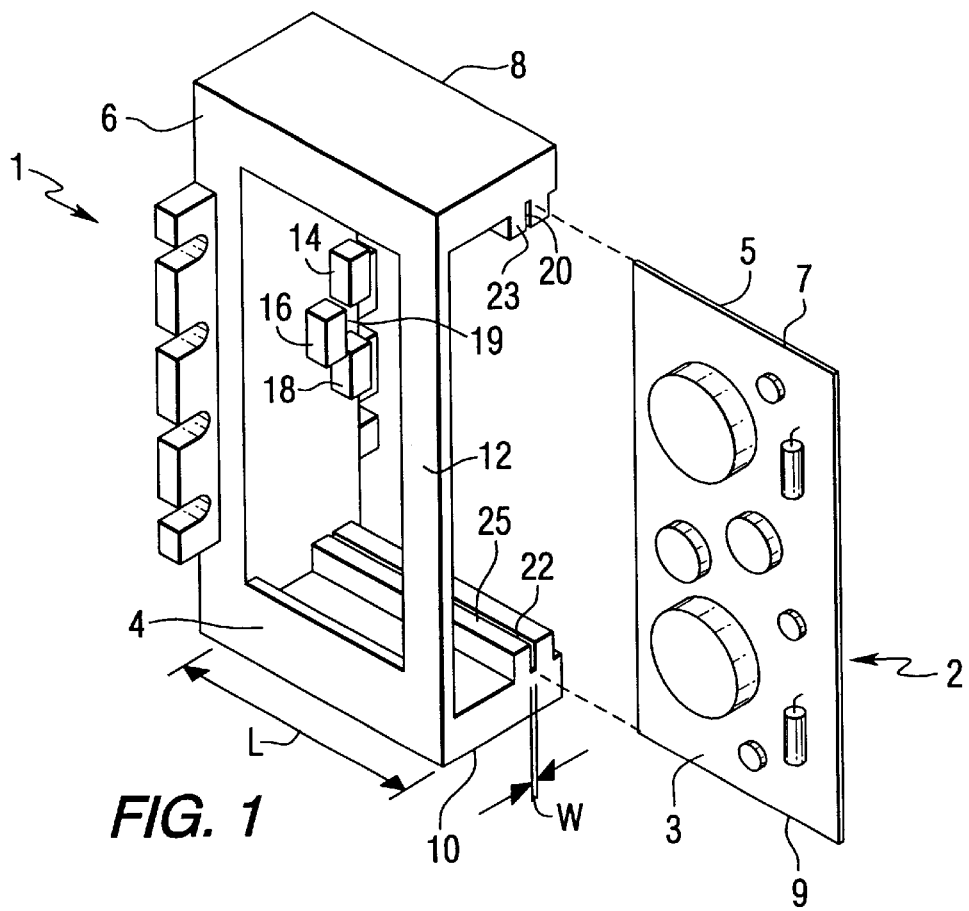
FIG. 1 is an exploded isometric view of the securement and voltage isolation device of the present invention showing a circuit board received into the device.

Referring now to FIG. 1, the securement and voltage isolation device 1 of the present invention is shown in conjunction with a circuit board 2 having sides 3,5 and side edges 7,9. The device 1 includes a housing 4 which is generally open and which has a base 6. It will be appreciated that the base could be formed as a separate piece from the housing 4 and attached to the housing 4 by conventional mechanical fasteners, such as screws, adhesives and the like. Opposing first and second side walls 8,10 are formed integrally with the base 6 and are positioned generally perpendicular with respect to the base 6. A stiffener such as bridge 12 connects the first side wall 8 and the second side wall 10 to establish general physical stiffness and a mechanical vibration tolerance for the device 1. The securement and voltage isolation device 1 of the present invention is preferably molded from a single piece of an electrically insulative material. The device 1 can be composed of resinous plastic such as an ABS polycarbonate material, or a material with similar characteristics.

Referring again to FIG. 1, during manufacturing assembly, the circuit board 2 is received into the housing 4 of the device 1 of the present invention into a set of opposing slots 20,22 which are formed respectively in the opposing side walls 8,10. The opposing slots 20,22 are preferably continuous and extend along substantially the entire longitudinal length L of the opposing side walls 8,10. The width W of the opposing slots 20,22 is provided to receive the side edges 7,9 of the installed circuit board 2 by application of suitable pressure, such as by manual installation, for example. To facilitate installation of the circuit board 2 into the housing 4, the slot 20 is positioned in substantial opposing alignment with respect to its counterpart slot 22. The positioning of the slots 20,22 permits the circuit board 2 to be positioned in a plane which is substantially parallel to the bridge 12 and which is substantially transverse to the side walls 8,10 and the base 6.

In addition, referring again to FIG. 1, the side walls may have a set of ribs 23,25 which extend from the side walls 8,10, respectively. The slots 20,22 can be formed longitudinally in the ribs 23,25, respectively, to alleviate the need for removing material from the side walls 8,10 to form the slots 20,22. It will be appreciated that the ribs 23,25 also provide additional support to the side walls 8,10 and the device 1 by serving to stiffen the physical structure of the device 1.

Referring again to FIG. 1, once received into the slots 20,22 and pressed into position, the circuit board 2 is further stabilized in the housing 4 by at least one projection such as projections 14,16,18 which press against the circuit board 2 with lateral support to further secure and stabilize the circuit board 2 firmly in position within the device 1. In FIG. 1, for example, the projections 14,18 press against the side 5 of a fully installed circuit board 2, and the projection 16 presses against the side 3 of the installed circuit board 2. The projections 14,16,18 can be positioned on the base 6 to form a securement recess 19 wherein the circuit board 2 is firmly received and further secured and maintained. In addition, the projections 14,16,18 are either attached to or integrally formed with the base 6. The purpose of the projections 14,16,18 is to provide additional stability for the sides 3,5 of the circuit board 2.

Figure 2:
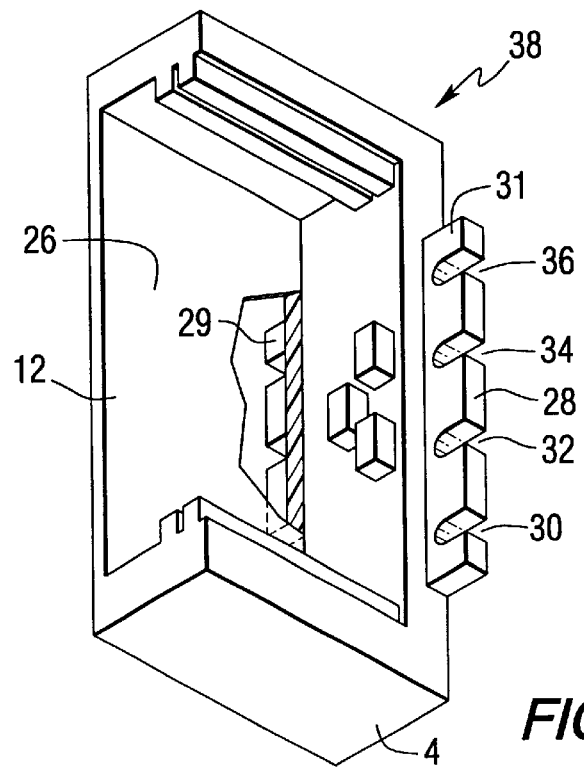
FIG. 2 is an isometric view of another embodiment of the present invention including a solid support wall partially cut away.

Referring now to FIG. 2, a substantial central portion of the housing 4 of the device 38 of the present invention can be provided as a solid support wall 26. The support wall 26 provides additional structural support to the device 38 and also alters the mass of the device 38 to change its vibration tolerance characteristics. It will be appreciated that the solid support wall 26 enables additional voltage isolation for an installed circuit board (not shown) by providing a solid piece of electrically insulative material to isolate voltages between individually secured circuit boards installed in the same enclosure.

Referring again to FIG. 2, the device 38 of the present invention further includes an attachment device 28 which has openings 30,32,34,36 formed therein. The attachment device 28 may be embodied as a pair of brackets 29,31 which are connected to or formed integrally with the base 6. It will be appreciated that the attachment device 28 may be provided on one or both sides of the base 6 and that openings 30,32,34,36 can be provided as any combination of slots, cutouts, holes, passages and the like suitable for receiving conventional mechanical fasteners therein to secure the device 38 to a suitable enclosure.

Figure 3:
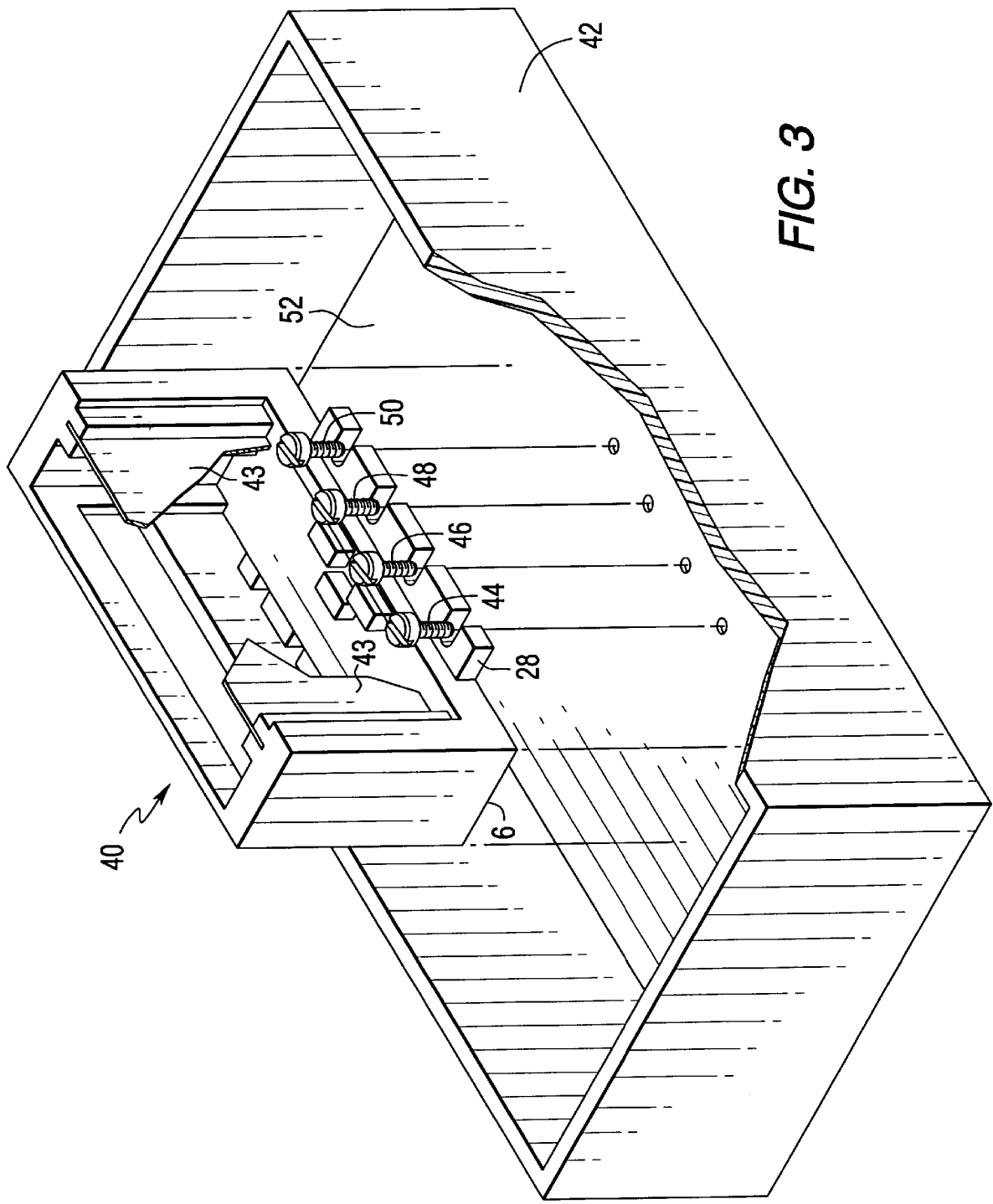
FIG. 3 is an exploded partially cut-away isometric view of the securement and voltage isolation device of the present invention installed in an electrical cabinet.

Referring now to FIG. 3, the attachment device 28 provides for securement of the entire device 40 to an enclosure such as an electrical cabinet 42. The device 40 of the present invention may be conventionally attached to the electrical cabinet 42 such as by using screws 44,46,48,50 to fasten the device 40 to the cabinet 42. The device 40 is preferably attached with its base 6 positioned in substantial intimate contact with the interior surface 52 of the electrical cabinet 42. The primary benefit of the assembly shown in FIG. 3 is that maximization of available space within the cabinet 42 is achieved by the positioning of a circuit board 43 within the device 40 in a perpendicular position relative to the cabinet 42.

Figure 4:
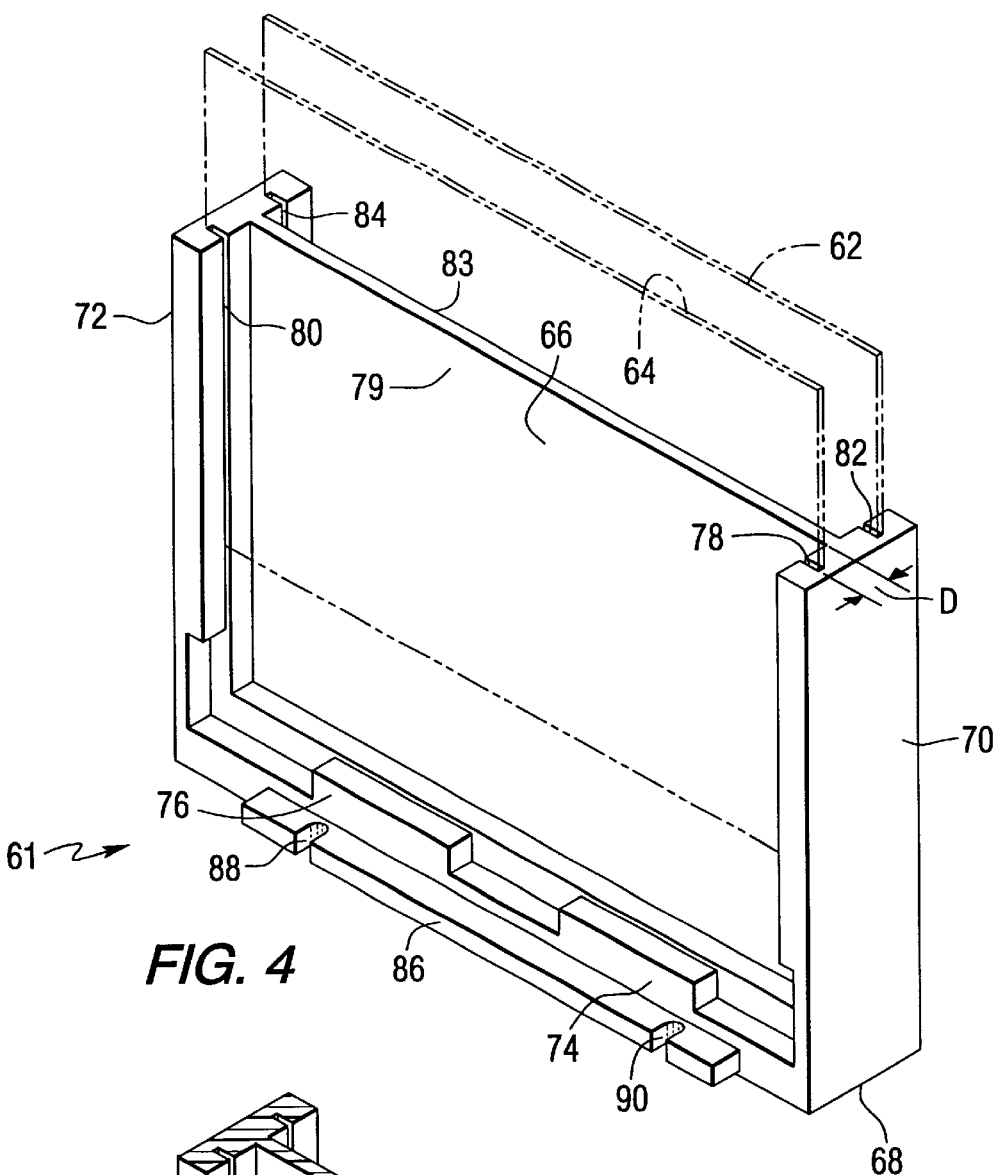
FIG. 4 is an exploded isometric view of an additional embodiment of the securement and voltage isolation device of the present invention; and, FIG. 5 is an isometric view of another embodiment of the device of the present invention.

In another embodiment of the present invention shown in FIG. 4, a securement and voltage isolation device 61 can be provided for use with at least two circuit boards 62, 64. A stiffener such as a support wall 66 is provided as a substantially continuous and solid piece of material which is formed integrally with a base 68 and opposing side walls 70,72. In operation the circuit boards 62,64 are received into two sets of opposing slots, a first set 78,80 and a second set 82,84. The first set of slots 78,80 is positioned generally adjacent to a first side 79 of the support wall 66 and the second set of slots 82,84 is positioned generally adjacent to a second side 83 of the support wall 66. The first set of slots 78,80 are formed, respectively, in opposing portions of the side walls 70,72 on the first side 79 of the support wall 66. The second set of slots 82,84 are formed, respectively, in opposing portions of the side walls 70,72 on the second side 83 of the support wall 66.

The slots 78,80,82,84 are formed in the side walls 70,72 a distance D from the support wall 66 as shown in FIG. 4. It will be understood that the distance D can be considered an offset distance which is designed to resist arcing of electrical energy from a component on one circuit board 62 to a component on the other circuit board 64 once the boards are installed and operating. It will be further understood that the distance which electrical energy must travel to arc between these components is considered to be a creep distance for these components. An increase in the distance D therefore results in an increase in the overall creep distance, which accordingly improves board to board voltage isolation between components. The distance D is preferably in the range from approximately 0.25 to 0.5 inches to provide the required board-board voltage isolation, which may be a medium voltage in the range of approximately 2,000 volts.

Figure 5:
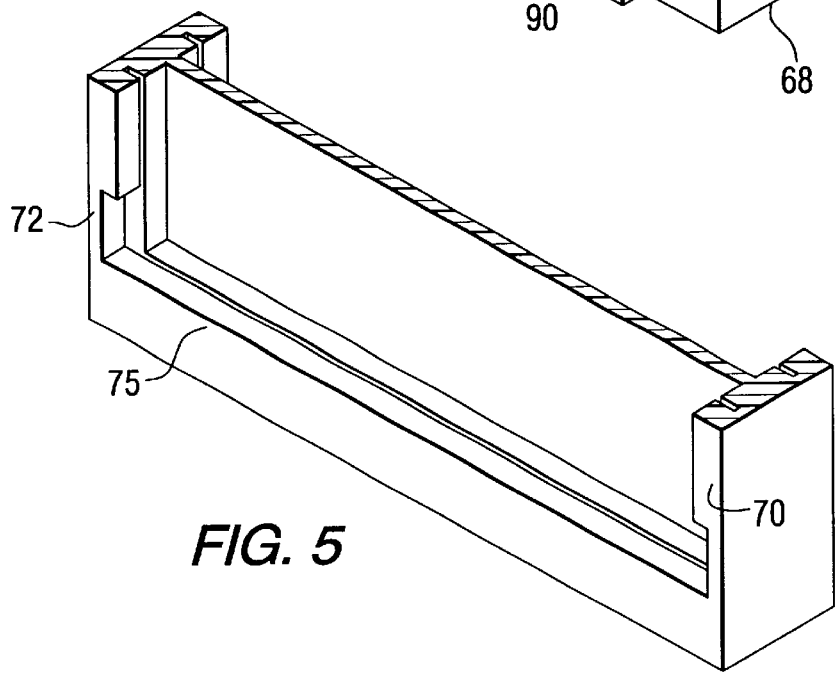

Referring once again to FIG. 4, a set of projections 74,76 can also be provided as segmented portions on one or both sides 79,83 of the support wall 66 of the device 61. As discussed previously, projection structures, with regard to the projections 74,76 assist the device 61 in further stabilizing one or more circuit boards 62,64 received into the device 61. These segmented portions can also be combined into a substantially continuous section 75 which bridges the opposing side walls 70,72, as shown more particularly in FIG. 5. Continuous sections (both not shown) substantially similar to the continuous section 75 can be provided on both sides 79,83 of the support wall 66 to provide support and stabilization to both circuit boards 62,64. The continuous section 75 provides a continuous flat surface which can bear against an installed circuit board and further stabilizes its securement within the device 61.

The primary advantage of this aspect of the present invention shown in FIG. 4 is that at least two circuit boards 62,64 can be installed and secured within substantially the same amount of space as required by a device which secures a single device. During assembly, the installed circuit board 62 is secured within the device 61 in a position substantially parallel to the installed circuit board 64. Each of the boards 62,64 is also secured in a position which is in a plane substantially parallel to the plane of support wall 66. In addition, the boards 62,64 and the support wall 66 are respectively secured and maintained in positions which are substantially transverse with respect to both the side walls 70,72 and the base 68. It will also be appreciated that the device 61 of this aspect of the present invention possesses a vibration tolerance dependent on the configuration of the device 61 and the mass and composition of the material used to construct the device 61. The vibration tolerance for the device 61 of this embodiment of the present invention is preferably sufficient to resist damage from vibrations such as mechanical vibrations caused by the rotating components of equipment including electric generators.

As shown in FIG. 4, the support wall 66 is preferably provided as a solid support wall. The bridge is alternatively provided with an opening or openings formed therein to reduce the amount of material required to construct the device. It will be appreciated, however, that a sufficient amount of material must be used to construct the support wall 66 so as to provide medium voltage isolation for board-to-board and board-to-enclosure voltage potential differences. To promote the physical stiffness of the device 61, the support wall 66 is also preferably positioned in a substantially perpendicular relationship with respect to the side walls 70,72 and also substantially perpendicular with respect to the base 68.

Referring again to FIG. 4, one or more attachment devices 86 are also provided integrally with or connected to the base 68. The attachment device 86 has openings 88,90 formed therein for attachment of the device 61 to an electrical cabinet (not shown), for example. It will be appreciated, however, that any number of openings could be formed in the attachment device 86. The number of openings employed, in conjunction with suitable mechanical fasteners such as screws, must enable secure attachment of the device 61 to an electrical housing. It will further be appreciated that the attachment device 86 may be provided on one or both sides of the base 68 and that openings 88,90 can be provided as any combination of slots, cutouts, holes, passages and the like suitable for receiving conventional mechanical fasteners therein. It will still further be appreciated that the base 68 may have one or more attachment devices formed integrally with the base and extending therefrom.

Whereas particular embodiments of the invention have been described for purposes of illustration, it will evident to those skilled in the art that variations and details may be made without departure from the invention as defined in the appended claims.

What is claimed is:

1. A molded circuit board securement and voltage isolation device for use with at least one circuit board having first and second sides and first and second edges, comprising:

an open housing having a base and opposing first and second side walls each positioned transversely with respect to said base;

stiffening means extending between said first and second side walls to establish a vibration tolerance for said device;

receiving means formed in said side walls for receiving said circuit board edges in said side walls and in substantially transversed alignment with respect to said base and said side walls; and further including stabilizing means extending from said base positioned adjacent to at least one of said circuit board sides for further securing said circuit board in said housing.

2. The device of claim 1, wherein said stabilizing means includes at least one projection extending from said base and positioned generally adjacent to at least one of said circuit board sides.

3. The device of claim 2, further including a plurality of said projections positioned generally adjacent to said first and second circuit board sides to form a securement recess between said projections in which said circuit board is received and stabilized.

4. A molded circuit board securement and voltage isolation device for use with more than one circuit board, comprising:

an open housing having a base and opposing first and second side walls each positioned transversely with respect to said base;

stiffening means extending between said first and second side walls to establish a vibration tolerance for said device;

a first receiving means formed in said side walls for receiving a first said circuit board in substantially transverse alignment with respect to said base;

a second receiving means formed in said side walls for receiving a second said circuit board in substantially transverse alignment with respect to said base, whereby said second circuit board is positioned substantially parallel to said first circuit board; and stabilizing means extending from said base for further securing at least one of said circuit boards in said housing.

* * * * *